(12) United States Patent
Kim

(10) Patent No.: US 7,546,231 B2
(45) Date of Patent: Jun. 9, 2009

(54) METHOD OF SIMULATING SEMICONDUCTOR INTEGRATED CIRCUIT

(75) Inventor: Jin Soo Kim, Bucheon (KR)

(73) Assignee: Dongbu Electronics Co., Ltd. (KR)

( * ) Notice: Subject to any disclaimer, the term of this patent is extended or adjusted under 35 U.S.C. 154(b) by 334 days.

(21) Appl. No.: 11/324,045

(22) Filed: Dec. 29, 2005

(65) Prior Publication Data

US 2006/0146460 A1 Jul. 6, 2006

(30) Foreign Application Priority Data

Dec. 30, 2004 (KR) ............... 10-2004-0117526

(51) Int. Cl.
*G06F 17/50* (2006.01)
(52) U.S. Cl. .............. 703/14; 703/18; 716/5; 716/6; 324/765
(58) Field of Classification Search ............. 703/14, 703/18; 716/5, 6; 702/179, 77; 324/126, 324/765; 257/346, 253
See application file for complete search history.

(56) References Cited

U.S. PATENT DOCUMENTS

| | | | | |
|---|---|---|---|---|
| 5,379,231 | A * | 1/1995 | Pillage et al. ............... | 703/14 |
| 5,596,506 | A * | 1/1997 | Petschauer et al. .......... | 716/5 |
| 7,039,888 | B2 * | 5/2006 | Steinmann et al. .......... | 716/5 |
| 2002/0045995 | A1 * | 4/2002 | Shimazaki et al. ......... | 702/77 |
| 2003/0083856 | A1 * | 5/2003 | Yoshimura et al. ......... | 703/18 |
| 2004/0015801 | A1 * | 1/2004 | Mielke et al. .............. | 716/6 |
| 2004/0211989 | A1 * | 10/2004 | Armgarth et al. .......... | 257/253 |
| 2004/0257063 | A1 * | 12/2004 | Kronrod et al. ............ | 324/126 |
| 2005/0027476 | A1 * | 2/2005 | Lim ......................... | 702/179 |
| 2005/0139915 | A1 * | 6/2005 | Saito et al. ................ | 257/346 |
| 2005/0218921 | A1 * | 10/2005 | Sanda et al. .............. | 324/765 |

FOREIGN PATENT DOCUMENTS

JP 2004-62346 A 2/2004

OTHER PUBLICATIONS

Kenji Oohata, Hiroshi Shimomura and Kyoko Hirata; "Apparatus and Method for Automatically Determining Device Size"; Patent Publication No. 2004-062346; Publication Date: Feb. 26, 2004; Patent Abstracts of Japan; Japan.

* cited by examiner

*Primary Examiner*—Paul L Rodriguez
*Assistant Examiner*—Kandasamy Thangavelu
(74) *Attorney, Agent, or Firm*—Andrew D. Fortney

(57) ABSTRACT

A method and computer program for simulating a semiconductor integrated circuit is disclosed, in which a voltage coefficient of resistance according to a variation of width or length of a resistor device of the integrated circuit may be accurately applied to a model in a manner of including the length and width in variables for measuring the resistance of the resistor device and by which efficiency of a circuit design is considerably enhanced. The method generally includes the steps of measuring a plurality of resistances of a plurality resistors having different length (L) and width (W) from each other while varying a voltage applied to the resistors respectively, calculating a voltage coefficient resist (VCR) of the resistors using the measured resistances, the VCR expressed as a linear function of voltage, and calculating resistance of a certain resistor device having a specific length and width using the VCR. The computer program is generally configured to calculate a voltage coefficient of resistance (VCR) of the resistor as a function of voltage (dV), length (L) and width (W).

19 Claims, 7 Drawing Sheets

METHOD OF SIMULATING SEMICONDUCTOR INTEGRATED CIRCUIT

This application claims the benefit of the Korean Patent Application No. P2004-117526, filed on Dec. 30, 2004, which is hereby incorporated by reference as if fully set forth herein.

BACKGROUND OF THE INVENTION

1. Field of the Invention

The present invention relates to a method of simulating a semiconductor integrated circuit. Although the present invention is suitable for a wide scope of applications, it is particularly suitable for accurately simulating the resistance of a device for variations in length, width, and voltage.

2. Discussion of the Related Art

Semiconductor integrated circuit designers often use circuit simulators to test circuit designs. Generally, a simulation test may be carried out to verify whether a semiconductor integrated circuit device will operate as designed or not prior to fabrication of the corresponding device. Many designers use simulation software derived from Simulation Program with Integrated Circuit Emphasis (SPICE).

SPICE circuit description files (*.cir files) generally comprise a netlist, or list of circuit elements and the nodes combining circuit elements. SPICE circuit description files may also comprise mathematical formulas describing the behavior of circuit elements. SPICE simulates a circuit model using both standard formulas and these custom mathematical formulas that define actions of various devices included in the circuit design, and provides the corresponding result as verification information.

In conventional SPICE circuit models, the resistance of a resistor element may have a linear relationship to voltage according to the formula:

$$R_{total} = R_{sh} * (L/W) * (1 + VC1 * dV);\qquad\text{[Formula 1]}$$

where $R_{total}$ is the total resistance of the resistor,
$R_{sh}$ is the sheet resistance, or resistance per unit area,
L is the length of the resistor,
W is the width of the resistor,
dV is the potential voltage across the resistor, and
VC1 is a linear voltage coefficient of resistance (VCR) of the resistor.

In an alternative conventional SPICE model, the resistance of a resistor element may have a non-linear (secondary functional) relationship to voltage according to the formula:

$$R_{total} = R_{sh} * (L/W) * (1 + VC2 * dV + VC3 * dV^2);\qquad\text{[Formula 2]}$$

where $R_{total}$ is the total resistance of the resistor,
$R_{sh}$ is the sheet resistance, or resistance per unit area,
L is the length of the resistor (e.g., the length of resistor 100 of FIG. 1),
W is the width of the resistor (e.g., the width of resistor 100 of FIG. 1),
VC2 and VC3 are non-linear voltage coefficients of resistance, and
dV is the potential voltage across the resistor.

Yet, if the model varying according to a voltage is identically applied regardless of the width and length of the resistor device like the modeling according to Formula 1 and Formula 2, the corresponding accuracy may be degraded. Specifically, if the sheet resistance is relatively high or if the resistance is considerably raised due to an increased length of the resistor, the voltage applied to the resistor device may have a larger influence on the resistance than suggested by Formula 1 or Formula 2. Hence, accuracy of the corresponding SPICE modeling may be considerably lowered.

Referring to FIGS. 2 to 4, plotted symbols indicate measured real resistance values; lines represent results of simulating resistance using a simulation model.

Referring to FIG. 2, if a sheet resistance per unit area $R_{sh}$ is measured while a voltage varying between 0V~60V is applied to various resistor devices differing in size, it can be seen that the measured sheet resistance varies with the voltage applied. Specifically, the sheet resistance varies with voltage and with the size of the corresponding resistor device. Therefore, conventional SPICE models may not accurately reflect the characteristics of real resistor devices.

FIG. 3 shows a graph of measured resistance and resistance as modeled according to Formula 1. For instance, if a resistance is calculated using the model of Formula 1 on the assumption that the resistance of a resistor device linearly depends on the voltage applied, a maximum value of error, as shown in the graph of FIG. 3, amounts to 12.77% since the model is identically applied regardless of the size of the resistor device. In FIG. 3, the X-axis indicates resistor devices have lengths between 0~100 μm, and the Y-axis indicates the total resistance of each resistor device.

FIG. 4 shows a graph of measured resistance and resistance as modeled according to Formula 2. FIG. 4 shows that Formula 2 does not accurately model the resistance of a resistor device, even if the model of Formula 2 is applied on the assumption that a resistance of a resistor device depends on of the applied voltage according to a secondary function. In FIG. 4, the X-axis indicates the length of a resistor device and the Y-axis indicates the total resistance. If the width of the resistor device according to a variation of length is set to 0.5 μm, 1 μm, 2 μm, 5 μm or 10 μm, the total resistance according to Formula 2 does not match the measured resistance. In particular, if the total resistance is calculated according to Formula 2 for a resistor device having a length of 100 μm and a width of 5 μm, the difference between calculated and measured resistance amounts to 59.9%.

The error of the conventional SPICE models, as shown in FIG. 3 and FIG. 4, becomes more pronounced if the length and/or width of the resistor device is small.

SUMMARY OF THE INVENTION

Accordingly, the present invention is directed to a method of simulating a semiconductor integrated circuit that substantially obviates one or more problems due to limitations and disadvantages of the conventional models.

An object of the present invention is to provide a method of simulating a semiconductor integrated circuit, by which characteristics of a resistor device may be accurately reflected.

Another object of the present invention is to provide a method of simulating a semiconductor integrated circuit, which can be commonly applied to various resistor devices differing in length (L) and width (W) and by which accuracy may be raised.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of simulating a semiconductor integrated circuit according to the present invention includes the steps of (a) measuring a plurality of resistances of a plurality resistors having different length (L) and width (W) from each other while varying a voltage applied to the resistors respectively, (b) calculating a voltage coefficient of resistance (VCR) of the resistors using the measured resistances, the VCR expressed as a linear function of voltage, and (c) calculating the resistance of a resistor device having a specific length and width using the VCR.

Preferably, the VCR may be calculated according to a function of the length (L) and width (W) of the resistor.

Preferably, a logarithm function of the calculated VCR may be expressed as 'Log [abs(VCR)]=a*Log(L)+b', where variables 'a' and 'b' may comprise functions of the width (W) of the corresponding resistor.

More preferably, the resistance may be calculated according to the formula '$R_{total}=R_{sh}*(L/W)*[1+(a*Log(L)+b)*dV]$', where $R_{total}$, $R_{sh}$ and dV indicate the resistance of the resistor device, the sheet resistance of the resistor device and a potential difference between both ends of the resistor device, respectively.

Preferably, the VCR may be calculated according to the formula '$VCR=VC4*10^{(VC5*LogW*LogL+VC6*LogL+VC7*LogW+VC8)}$', where the VC4 to VC8 are coefficients indicating influence the voltage has on the resistance of the resistor device.

More preferably, the resistance may be calculated according to the formula '$R_{total}=R_{sh}*(L/W)*(1+VC4*10^{(VC5*LogW*LogL+VC6*LogL+VC7*LogW+VC8)})$'.

In an exemplary embodiment, the present invention relates to a computer program or waveform containing a set of instructions which, when executed by a processing device configured to execute computer-readable instructions, is configured to calculate a voltage coefficient of resistance (VCR) of the resistor as a function of voltage (dV), length (L) and width (W).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Wherever possible, the same reference numbers will be used throughout the drawings to refer to the same or like parts.

In one embodiment, the present invention relates to a method of simulating a semiconductor integrated circuit. The method generally includes the steps of (a) measuring a plurality of resistances of a plurality resistors having different lengths and widths while varying a voltage applied to the resistors respectively, (b) calculating a voltage coefficient of resistance (VCR) of the resistors using the measured resistances, the VCR expressed as a linear function of voltage, and (c) calculating the resistance of a resistor device having a specific length and width using the VCR.

In another embodiment, the present invention relates to a computer program or waveform containing a set of instructions which, when executed by a processing device configured to execute computer-readable instructions, is configured to calculate a voltage coefficient of resistance (VCR) of the resistor as a function of voltage (dV), length (L) and width (W).

It will be recognized that a person skilled in the art may implement the methods in software, firmware, and/or hardware, or that the software may be programmable to accommodate input or calculation of the coefficients. Thus, the invention may also include algorithms, computer program(s), and/or software, implementable and/or executable in a general purpose computer or workstation, configured to perform one or more steps of the inventive method (described below).

An Exemplary Method

In one preferred embodiment of the present invention, a method for simulating a resistor device may be carried out by the following steps to verify an operation of a semiconductor integrated circuit device.

In a first step, a resistance may be measured when a voltage applied to a resistor device differing in length L and width W is changed. Each measured resistance may be expressed as a linear function of voltage, in which a slope of the linear function becomes a new variable having a resistance varied according to a voltage. The new variable is called a VCR (voltage coefficient of resistance). The VCR may be calculated according to a function of the length and width of a resistor device.

Figure 5:
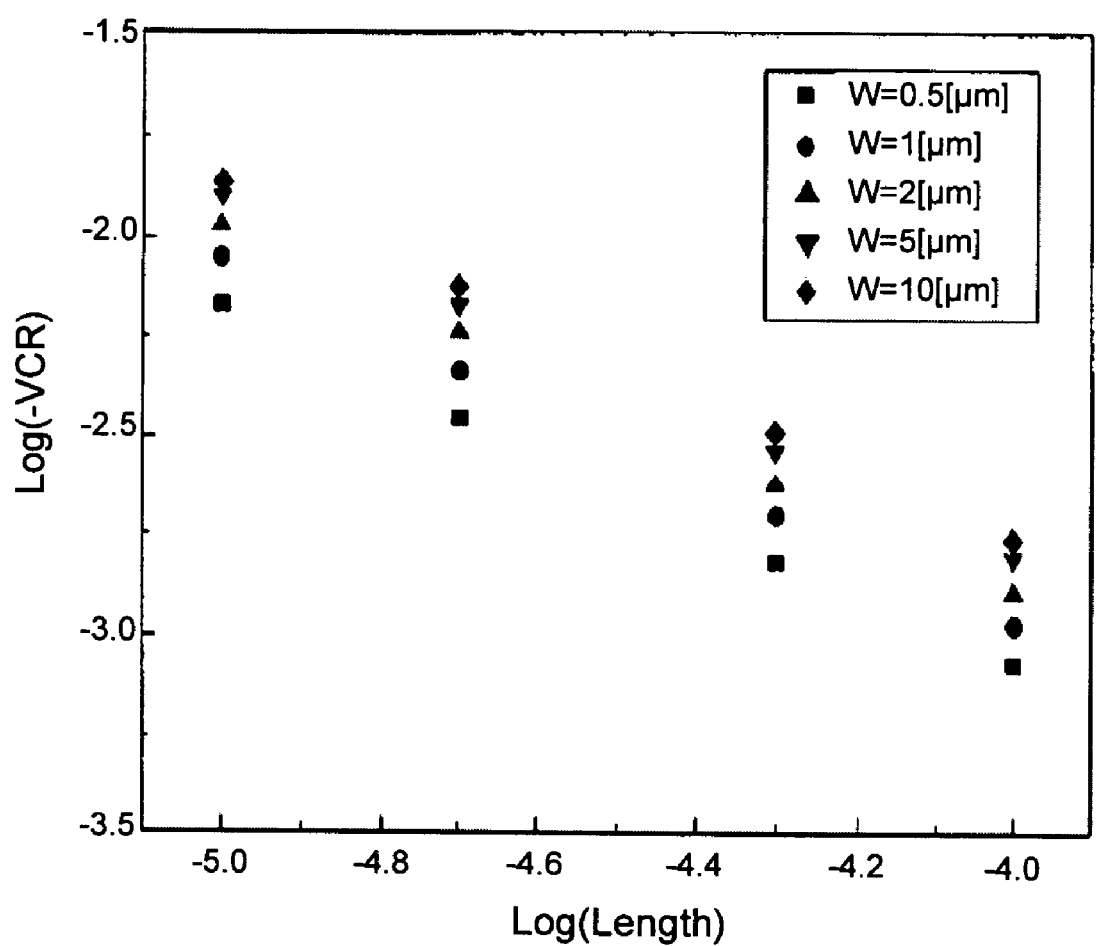
FIG. 5 is a graph representing a voltage coefficient of resistance (VCR) according to voltage as a logarithm function for a length of a resistor device in a simulation method according to the present invention.

In a second step, the above-calculated VCR may be expressed as a logarithmic function of the length of the resistor device, which is shown in the graph of FIG. 5. In FIG. 5, the Y-axis represents a logarithm value of the VCR to indicate 'Log [abs(VCR)]' to 'Log(L)' for widths of 0.5 µm, 1 µm, 2 µm, 5 µm and 10 µm of the resistor device. As can be seen from the graph of FIG. 5, the graph of the length and VCR for each of the resistor device widths varies linearly. Therefore, the total resistance may be calculated according to the formula:

$$R_{total}=R_{sh}*(L/W)*(1+f(W,L)*dV) \quad \text{[Formula 3]}$$

In Formula 3, 'f(W, L)' may comprise a function of the length and width of the device, which may be calculated according to the formula:

$$F(W,L): \text{Log}(abs(VCR))=a*\text{Log}(L)+b \quad \text{[Formula 4]}$$

Figure 6:
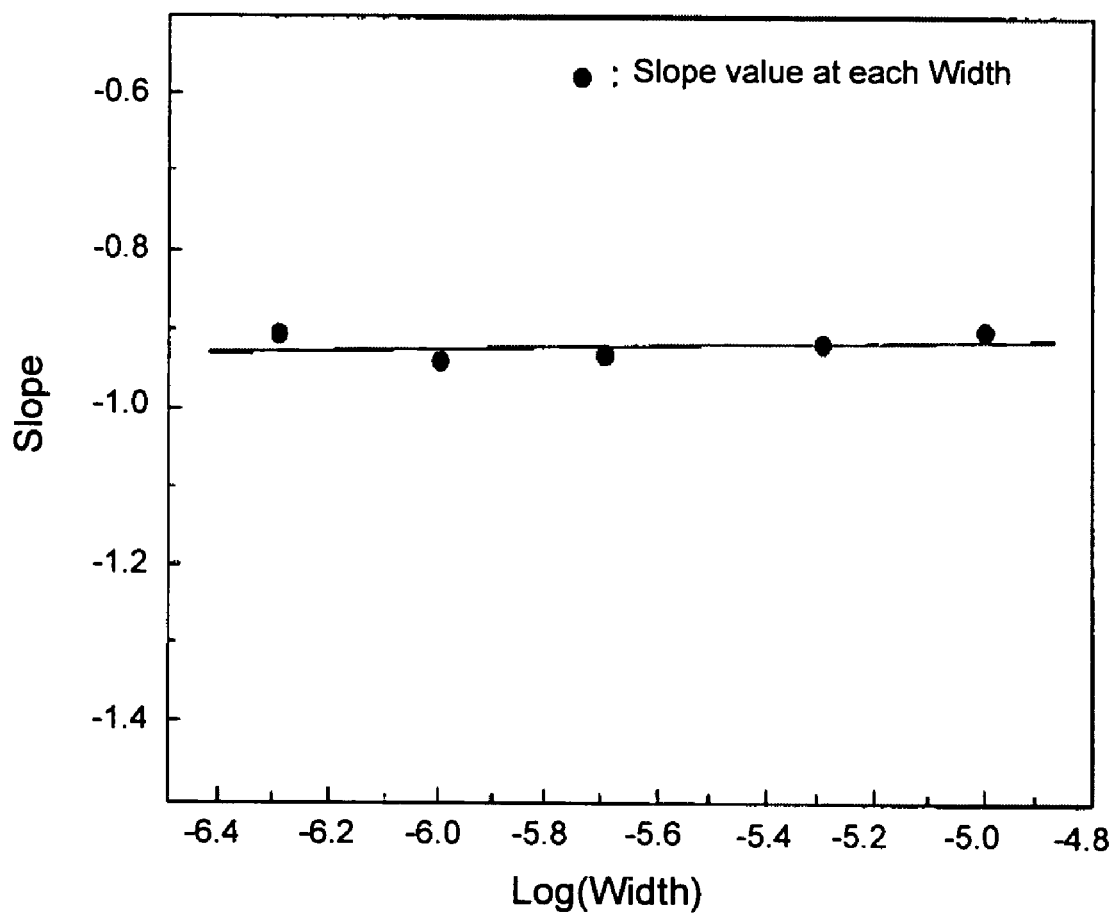
FIG. 6 is a graph representing a slope of a voltage coefficient of resistance (VCR) varying linearly with the width and length of a device in a simulation method according to the present invention.

In a third step, a slope (variable a) varying with the width of the resistor device is shown in FIG. 6. A linear function having the width as a variable becomes the slope (variable a) of Formula 4.

Figure 7:
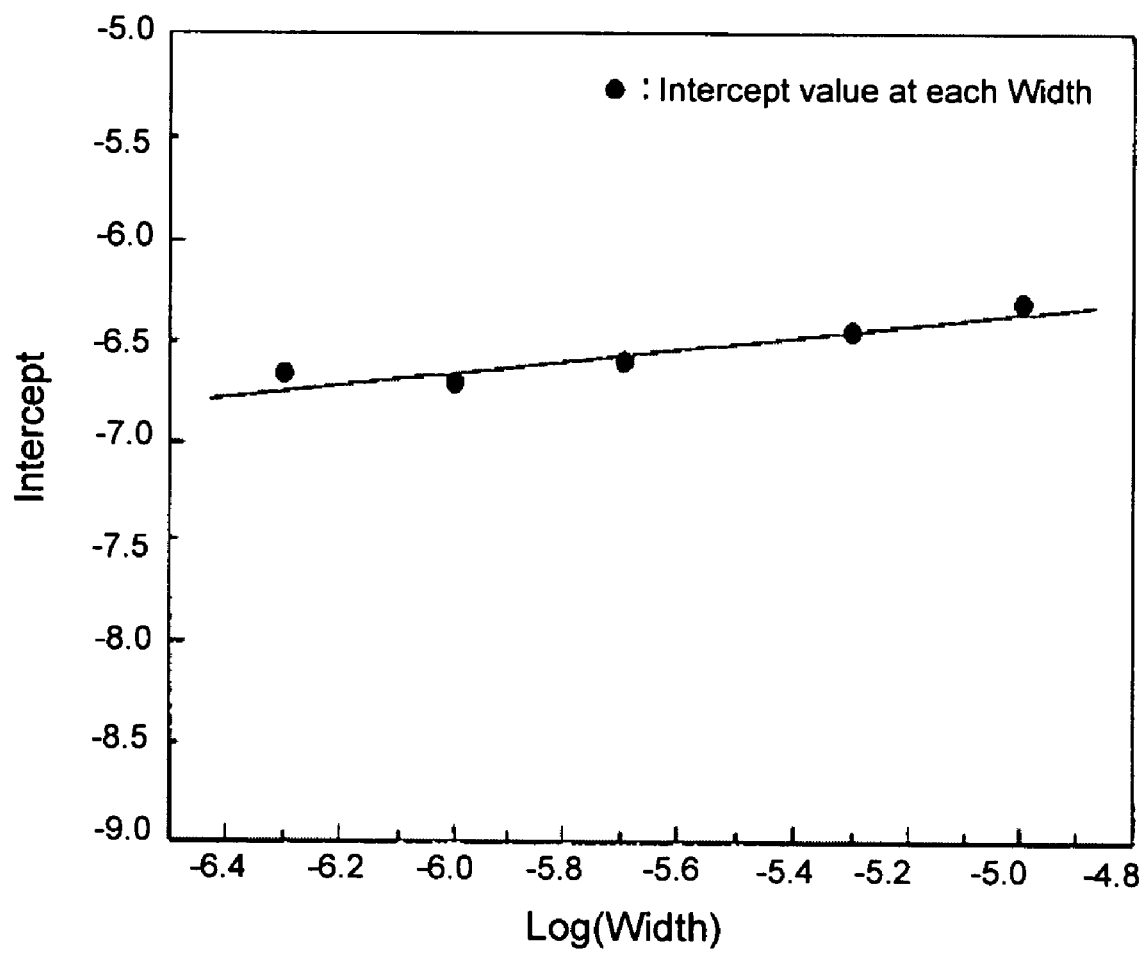
FIG. 7 is a graph representing an intercept of a voltage coefficient of resistance (VCR) varying linearly with the width and length of a device in a simulation method according to the present invention.

FIG. 7 shows an intercept (variable b) of the Y-axis corresponding to each width of the resistor device. A linear function of the width corresponds to the intercept (variable b) of Formula 4.

Hence, if we develop the slope 'a' found from FIG. 6 and the intercept 'b' found from FIG. 7 to the VCR, a new voltage coefficient of resistance (VCR) varying with the width and length of the resistor device, according to Formula 5, can be obtained. Furthermore, a method of calculating a new resistance of the resistor device can be expressed as Formula 6.

$$VCR=VC4*10^{(VC5*LogW*LogL+VC6*LogL+VC7*LogW+VC8)} \quad \text{[Formula 5]}$$

$$R_{total}=R_{sh}*(L/W)*(1+VC4*10^{(VC5*LogW*LogL+VC6*LogL+VC7*LogW+VC8)}) \quad \text{[Formula 6]}$$

As shown in Formulas 5 and 6, a voltage coefficient of resistance according to the present invention may comprise a function of voltage, length, and width of the resistor device. Hence, the simulation method according to the present invention can more accurately reflect the electrical characteristics of resistor devices of various lengths and widths.

Meanwhile, 'VC4' in Formula 5 may represent a constant determining increase or decrease of the resistance according to the voltage variation. Where VC4 is positive, the resistance may be increased. Where VC4 is negative, the resistance may be decreased. 'VC5' may represent a coefficient depending on a multiplication of the width (W) and length (L) of the resistor. 'VC6' may represent a coefficient depending on the length (L) of the resistor. 'VC7' may represent a coefficient depending on the width (W) of the resistor. Finally, 'VC8' may represent an arbitrary constant.

Figure 1:
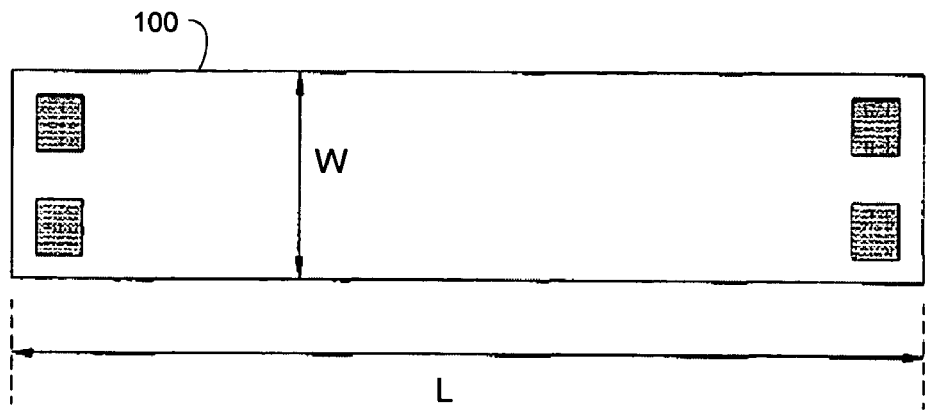
FIG. 1 is a schematic diagram for a length and width of a resistor device to explain device variable extraction.
Figure 2:
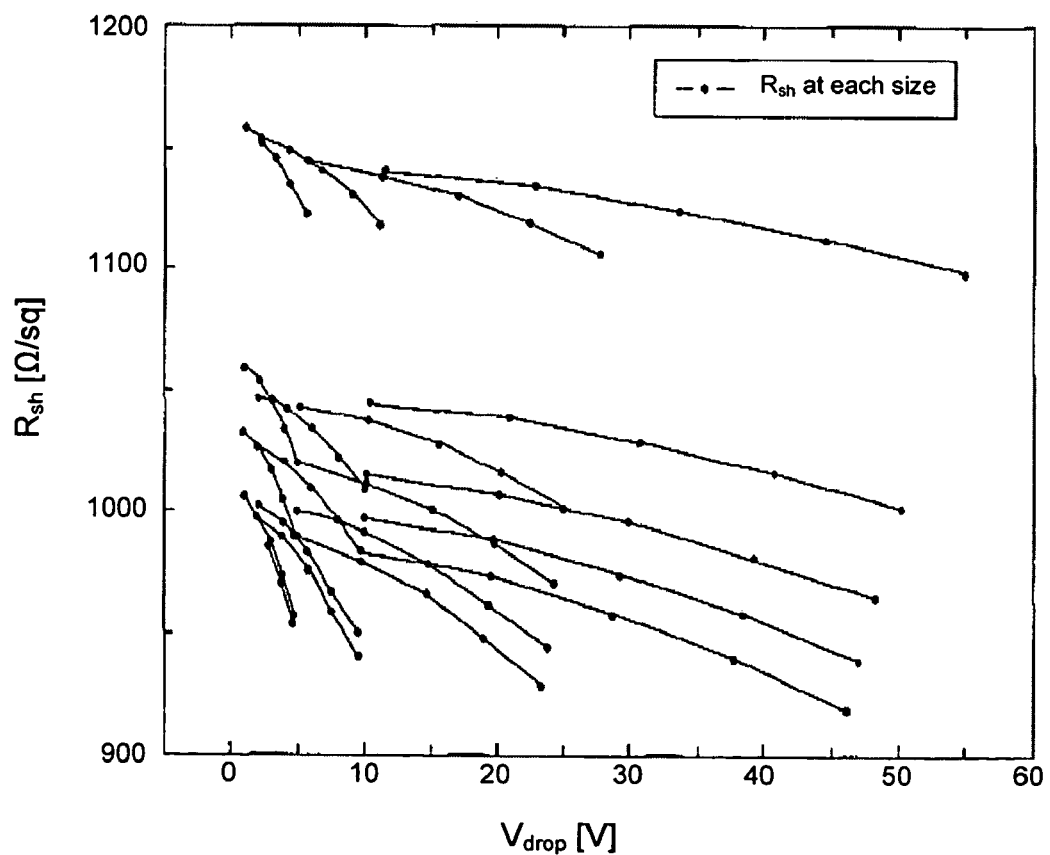
FIG. 2 is a graph of a variation of unit resistance measured by changing a voltage value applied to various resistor devices differing in size.
Figure 3:
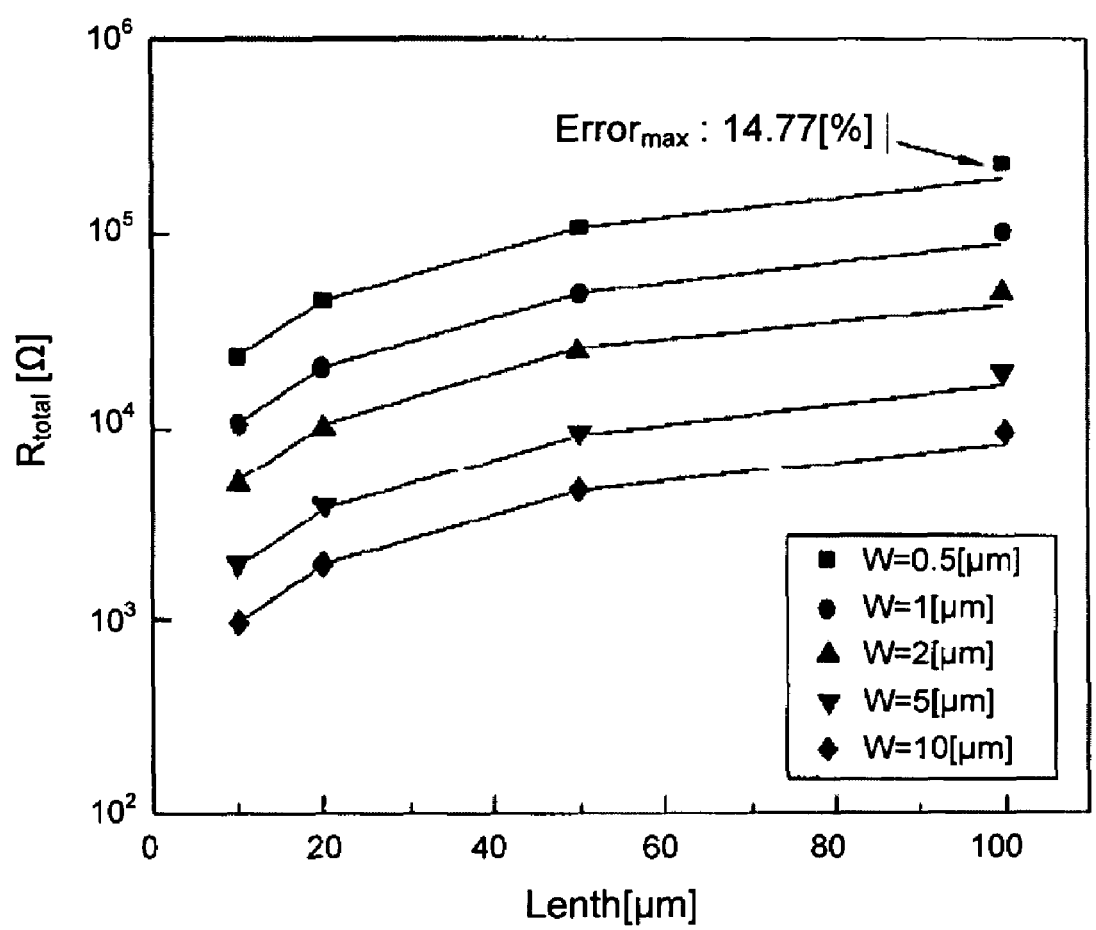
FIG. 3 is a graph of a result of calculating a resistance by applying a conventional SPICE model according to Formula 1 on the assumption that a variation of voltage applied to a resistor device has linear influence on the resistance.
Figure 4:
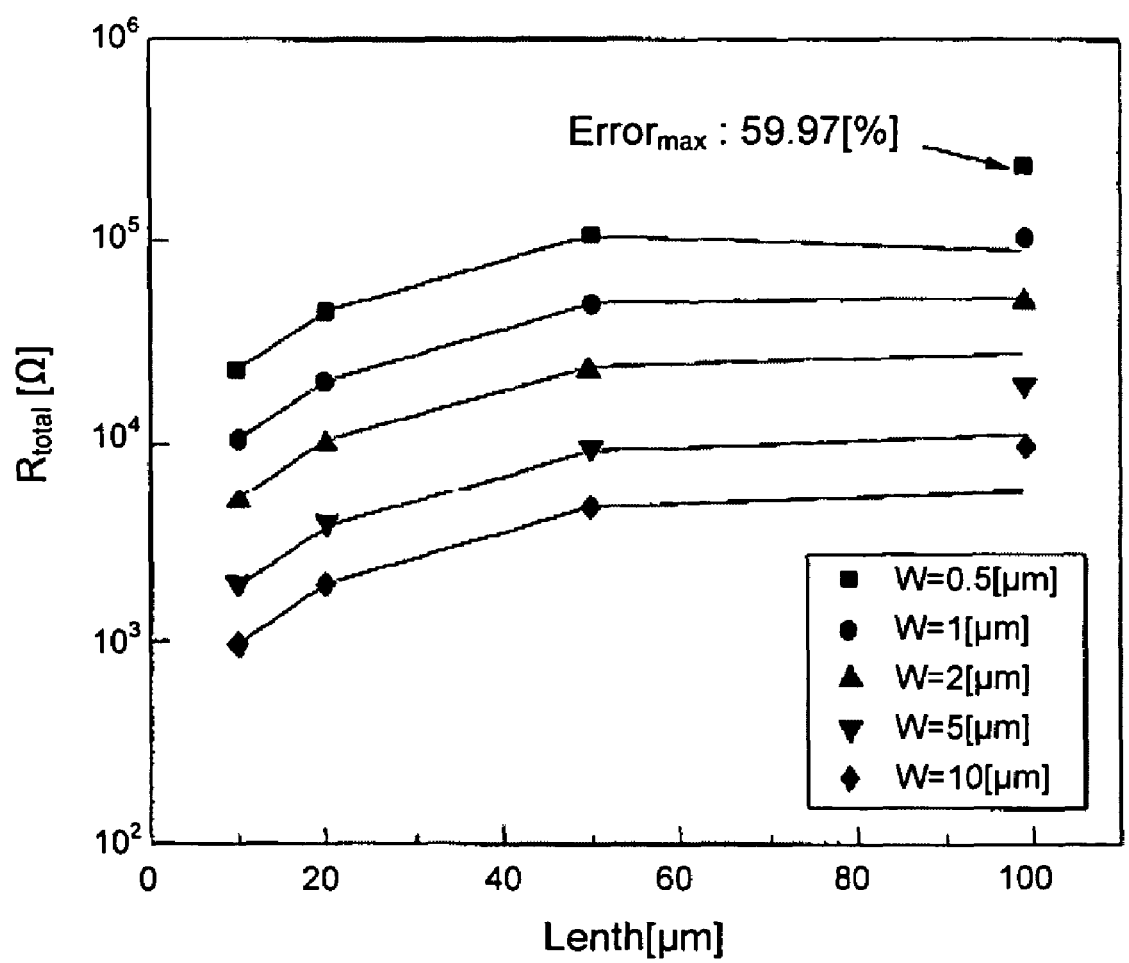
FIG. 4 is a graph of a result of calculating a resistance by applying a conventional SPICE model according to Formula 2 on the assumption that a variation of voltage applied to a resistor device has non-linear influence on the resistance.
Figure 8:
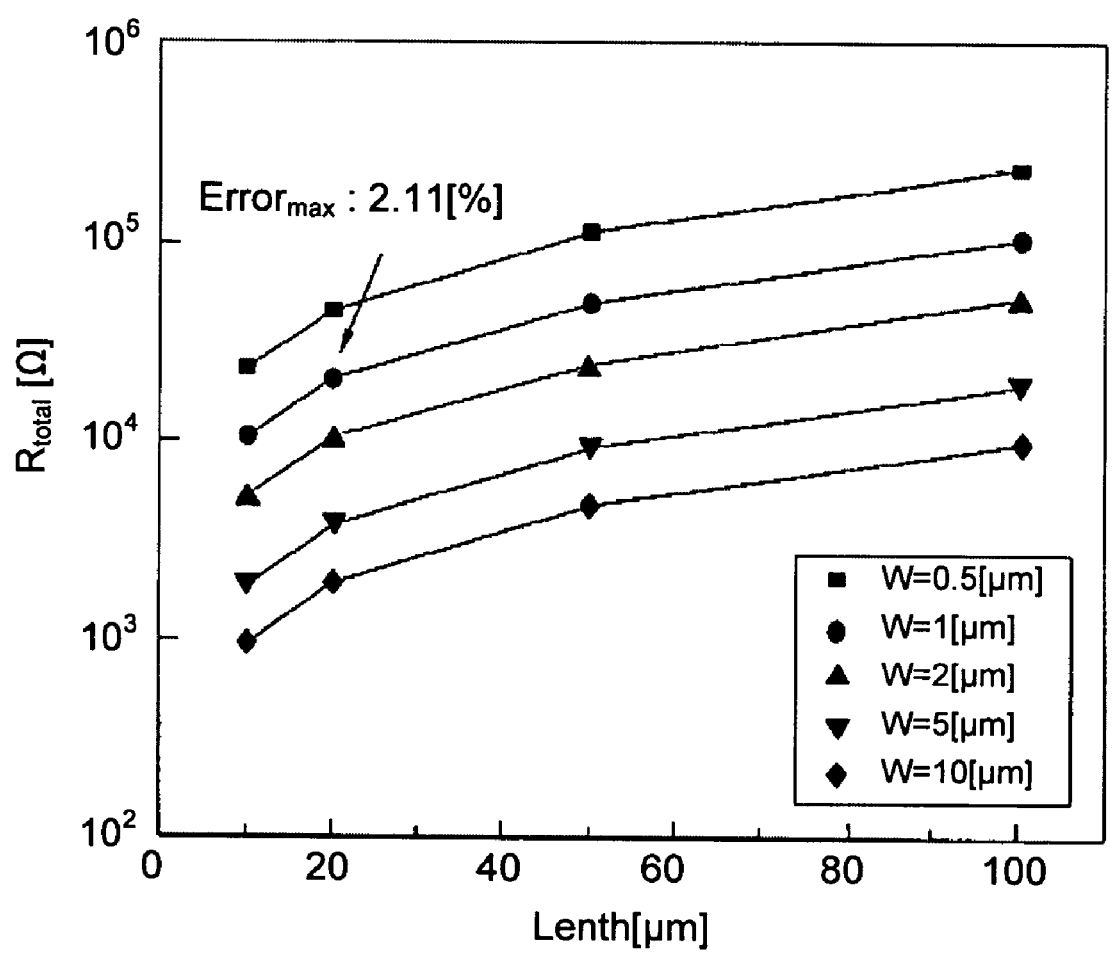
FIG. 8 is a graph representing the calculated resistance of a resistor device using a simulation method according to the present invention.

Referring now to FIG. 8, plotted symbols indicate measured real resistance values; lines represent results of the simulation model of the resistor device according to the present invention. In FIG. 8, the X-axis represents the length of a resistor device. The Y-axis represents the total resistance. FIG. 8 demonstrates that simulations of the total resistance of resistor devices for widths of 0.5 μm, 1 μm, 2 μm, 5 μm and 10 μm have a maximum error of only 2.11%. Hence, compared to the results of the conventional SPICE models shown in FIG. 3 and FIG. 4, the results for the present invention demonstrate improved accuracy.

It will be recognized that a person skilled in the art may derive the values of coefficients VC4, VC5, VC6, VC7, and VC8 from the previously described resistance measurements of actual resistors.

In a preferred embodiment, resistance modeling according to the present invention may be applied to polysilicon resistors (e.g., resistors comprising polycrystalline Si).

An Exemplary Computer Program

The invention may further relate to a computer program, computer-readable medium or waveform containing a set of instructions which, when executed by an appropriate processing device (e.g., a signal processing device, such as a microcontroller, microprocessor or DSP device), is configured to perform one or more steps of the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device, or application-specific [integrated] circuit).

In an exemplary embodiment, the present invention relates to a computer program or waveform containing a set of instructions which, when executed by a processing device configured to execute computer-readable instructions, is configured to calculate a voltage coefficient of resistance (VCR) of the resistor as a function of voltage (dV), length (L) and width (W).

In a further embodiment, the invention relates to a simulation program with integrated circuit emphasis (SPICE) netlist comprising instructions for calculating resistance according to the present invention.

In another embodiment, the computer program may model the resistance of polysilicon resistors (e.g., resistors comprising polycrystalline Si).

In another embodiment, the computer program may be further configured to calculate a resistance of the resistor device based at least in part on the VCR. In a further embodiment, the computer program may be configured to calculate said VCR according to the equation '$VCR=VC4*10^{(VC5*LogW*LogL+VC6*LogL+VC7*LogW+VC8)}$', where VC4, VC5, VC6, VC7, and VC8 comprise coefficients indicating influence of voltage, length, and width on the resistance of the resistor device. It will be recognized that these coefficients may be derived according to the method, above, of measuring of a plurality of resistances of a plurality resistors having different lengths and/or widths while varying a voltage applied to the resistors.

In a further embodiment, the computer program may be configured to calculate the resistance of the resistor device according to the equation '$R_{total}=R_{sh}*(L/W)*(1+VC4*10^{(VC5*LogW*LogL+VC6*LogL+VC7*LogW+VC8)})$', where the coefficients VC4, VC5, VC6, VC7, and VC8 are as described above.

Accordingly, the present invention provides the following effects or advantages.

First, the simulation method according to the present invention can accurately reflect the variation of the resistance according to the variation of the length or width of the resistor device.

Secondly, by accurately reflecting the voltage variation according to the variation of the width or length of the resistor device in the simulation method, the present invention considerably enhances the efficiency in circuit design.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of simulating a semiconductor integrated circuit, comprising the steps of:
   measuring a plurality of resistances of a plurality of resistors having different length (L) and width (W) from each other while varying a voltage applied to the resistors respectively;
   calculating a voltage coefficient of resistance (VCR) of the resistors using the measured resistances in accordance with Log(abs(VCR))=a*Log(L)+b, where a and b are functions of the width (W) of a resistor device; and
   calculating a simulated resistance of one or more simulated resistor devices in an integrated circuit resistance model using the VCR, wherein each of said simulated resistor devices has a specific length and width.

2. The method of claim 1, wherein the resistance is calculated in accordance with the following integrated circuit resistance model:

$$R_{total}=R_{sh}*(L/W)*[1+(a*Log(L)+b)*dV]$$

wherein the $R_{total}$, $R_{sh}$, and dV indicate the resistance of the resistor device, the resistance per unit area of the resistor device, and a potential difference between both ends of the resistor device, respectively.

3. The method of claim 2, further comprising fabricating the plurality of resistors having different length (L) and width (W) according to a semiconductor manufacturing process.

4. The method of claim 3, further comprising validating said integrated circuit model for said semiconductor manufacturing process using said simulated resistance.

5. The method of claim 1 wherein the VCR is calculated according to:

$$VCR=VC4*10^{(VC5*LogW*LogL+VC6*LogL+VC7*LogW+VC8)},$$

wherein VC4, VC5, VC6, VC7, and VC8 comprise coefficients indicating influence of voltage, length, and width on the resistance of the resistor device.

6. The method of claim 5, wherein:
   VC4 represents a positive or negative correlation of $R_{total}$ to voltage;
   VC5 represents a coefficient that relates the width (W) and length (L) of a resistor to the VCR;
   VC6 represents a coefficient that relates the length (L) of the resistor to the VCR;
   VC7 represents a coefficient that relates the width (W) of the resistor to the VCR; and
   VC8 is a constant.

7. The method of claim 1, wherein said resistor device comprises a poly-silicon resistor.

8. A method of simulating a semiconductor integrated circuit, comprising the steps of:
   measuring a plurality of resistances of a plurality resistors having different length (L) and width (W) from each other while varying a voltage applied to the resistors respectively;
   calculating a voltage coefficient of resistance (VCR) of the resistors using the measured resistances in accordance with $VCR=VC4*10^{(VC5*LogW*LogL+VC6*LogL+VC7*LogW+VC8)}$, wherein VC4, VC5, VC6, VC7, and VC8 comprise coefficients indicating influence of voltage, length, and width on a resistance of of a resistor device; and
   calculating a simulated resistance of one or more simulated resistor devices in an integrated circuit model using the VCR, wherein each of said simulated resistor devices has a specific length and width.

9. The method of claim 8, wherein the resistance is calculated using the following numerical formula:

$$R_{total}=R_{sh}*(L/W)*(1+VC4*10^{(VC5*LogW*LogL+VC6*LogL+VC7*LogW+VC8)}),$$

wherein the $R_{total}$ and $R_{sh}$ indicate the resistance of the resistor device and the resistance per unit area of the resistor device, respectively.

10. The method of claim 8, wherein said coefficients VC4, VC5, VC6, VC7, and VC8 comprise coefficients derived from said measuring step.

11. The method of claim 8, wherein said resistor device comprises a poly-silicon resistor.

12. The method of claim 9, wherein:
   VC4 represents a positive or negative correlation of $R_{total}$ to voltage;
   VC5 represents a coefficient that relates the width (W) and length (L) of a resistor to the VCR;
   VC6 represents a coefficient that relates the length (L) of the resistor to the VCR;
   VC7 represents a coefficient that relates the width (W) of the resistor to the VCR; and
   VC8 is a constant.

13. The method of claim 8, further comprising deriving said coefficients from said measured resistances.

14. A computer readable storage medium comprising computer-executable instructions which when executed in a computer calculate resistances of one or more resistor devices, the instructions comprising instructions for:
   receiving measurement data of a plurality of resistances of a plurality of resistors having different lengths and/or widths, the measurements made while varying a voltage applied to the resistors respectively;
   calculating a voltage coefficient of resistance (VCR) of the resistors as a function of length (L) and width (W) in accordance with $VCR=VC4*10^{(VC5*LogW*LogL+VC6*LogL+VC7*LogW+VC8)}$, wherein VC4, VC5, VC6, VC7, and VC8 comprise coefficients indicating influence of voltage, length, and width on a resistance of a resistor device; and
   calculating a simulated resistance of one or more simulated resistor devices in an integrated circuit model using the VCR, wherein each of said simulated resistor devices has a specific length and width.

15. The medium of claim 14, further comprising a Simulation Program with Integrated Circuit Emphasis (SPICE) netlist including said instructions.

16. The medium of claim 14, wherein said resistor device comprises a poly-silicon resistor.

17. The medium of claim 14, further configured to calculate said resistance according to the equation:

$$R_{total}=R_{sh}*(L/W)*(1+VC4*10^{(VC5*LogW*LogL+VC6*LogL+VC7*LogW+VC8)}),$$

wherein the $R_{total}$ and $R_{sh}$ indicate the resistance of the resistor device and the resistance per unit area of the resistor device, respectively.

18. The medium of claim 17, wherein said coeffecients comprise coefficients derived from the measurement of a plurality of resistances of a plurality of resistors having different lengths and/or widths while varying a voltage applied to the resistors.

19. The medium of claim 14, wherein:
VC4 represents a positive or negative correlation of $R_{total}$ to voltage;
VC5 represents a coefficient that relates the width (W) and length (L) of a resistor to the VCR;
VC6 represents a coefficient that relates the length (L) of the resistor to the VCR;
VC7 represents a coefficient that relates the width (W) of the resistor to the VCR; and
VC8 is a constant.

* * * * *